(12) United States Patent
Morikawa et al.

(10) Patent No.: US 10,265,988 B2
(45) Date of Patent: Apr. 23, 2019

(54) FLEXOGRAPHIC PRINTING PLATE (71) Applicant: FUJIFILM Corporation, Tokyo (JP)

(72) Inventors: Seiichiro Morikawa, Shizuoka (JP);
Yusuke Namba, Shizuoka (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 15/904,894

(22) Filed: Feb. 26, 2018

(65) Prior Publication Data

US 2018/0186161 A1 Jul. 5, 2018

Related U.S. Application Data

(63) Continuation of application No. PCT/JP2016/078238, filed on Sep. 26, 2016.

(30) Foreign Application Priority Data

Sep. 25, 2015 (JP) .................. 2015-188682

(51) Int. Cl.
*B41N 1/16* (2006.01)
*B41N 1/22* (2006.01)
(Continued)

(52) U.S. Cl.
CPC .................. *B41N 1/12* (2013.01); *B41C 1/05* (2013.01); *B41C 1/18* (2013.01); *B41N 1/16* (2013.01);
(Continued)

(58) Field of Classification Search
None
See application file for complete search history.

(56) References Cited

U.S. PATENT DOCUMENTS

| 2010/0143841 A1 | 6/2010 | Stolt et al. |
| 2011/0255134 A1 | 10/2011 | Shigeta et al. |
| 2014/0087306 A1 | 3/2014 | Blomquist et al. |

FOREIGN PATENT DOCUMENTS

| EP | 2 572 890 A1 | 3/2013 |
| JP | 2002-293049 A | 10/2002 |

(Continued)

OTHER PUBLICATIONS

International Search Report for PCT/JP2016/078238 dated Dec. 13, 2016.

(Continued)

*Primary Examiner* — Joshua D Zimmerman
(74) *Attorney, Agent, or Firm* — Sughrue Mion, PLLC (57) ABSTRACT

An object of the present invention is to provide a flexographic printing plate having excellent ink transferability in a solid portion and the like and having good printing quality in a halftone portion. The flexographic printing plate of the present invention is a flexographic printing plate having a relief layer including a non-image area and an image area, in which the image area has a halftone dot portion having a halftone dot area ratio of more than 0% and less than 100%, and a solid portion having a halftone dot area ratio of 100%, small dots in the halftone dot portion and the solid portion or small dots in the halftone dot portion have two or more recessed portions having different depths according to a halftone dot area ratio, and the two or more recessed portions having different depths are recessed portions whose depth becomes deeper as the halftone dot area ratio increases.

20 Claims, 5 Drawing Sheets

(51) Int. Cl.
    *B41C 1/05*    (2006.01)
    *B41C 1/18*    (2006.01)
    *B41N 1/12*    (2006.01)
    *G03F 7/00*    (2006.01)
    *B41M 1/04*    (2006.01)

(52) U.S. Cl.
    CPC ............... *B41N 1/22* (2013.01); *B41M 1/04* (2013.01); *B41P 2200/12* (2013.01); *G03F 7/00* (2013.01)

(56) References Cited

FOREIGN PATENT DOCUMENTS

| | | |
|---|---|---|
| JP | 2008-000927 A | 1/2008 |
| JP | 2009286113 A | 12/2009 |
| JP | 2010-032603 A | 2/2010 |
| JP | 2012-511175 A | 5/2012 |
| JP | 2013-188961 A | 9/2013 |
| JP | 2014-069575 A | 4/2014 |

OTHER PUBLICATIONS

International Preliminary Report on Patentability dated Mar. 27, 2018 from the International Bureau in counterpart International application No. PCT/JP2016/078238.
Written Opinion, dated Dec. 13, 2016 from the International Bureau in counterpart International application No. PCT/JP2016/078238.
The Extended European Search Report dated Oct. 1, 2018, issued by the European Patent Office in corresponding application No. 16848709.8.

FLEXOGRAPHIC PRINTING PLATE

CROSS-REFERENCE TO RELATED APPLICATIONS

This application is a Continuation of PCT International Application No. PCT/JP2016/078238 filed on Sep. 26, 2016, which claims priority under 35 U.S.C. § 119(a) to Japanese Patent Application No. 2015-188682 filed on Sep. 25, 2015. The above application is hereby expressly incorporated by reference, in its entirety, into the present application.

BACKGROUND OF THE INVENTION

1. Field of the Invention

The present invention relates to a flexographic printing plate.

2. Description of the Related Art

A flexographic printing plate having a flexible relief forming layer made of resin or rubber has a relatively soft projecting portion (image area) for printing and can conform to various shapes. Therefore, a flexographic printing plate is used for printing performed on objects to be printed made of various materials, thick objects to be printed, and the like.

An image area of a flexographic printing plate is constituted of a solid portion that is printed by filling the portion with ink by fully transferring the ink, and/or halftone dot portions constituted of a large number of small projecting dots (projections) expressing the gradation of an image printed on an object to be printed by changing the size or density of the small dots. A flexographic printing plate is placed on the peripheral surface of a cylindrical drum, and while a roller is being rotated, the flexographic printing plate is brought into contact with an object to be printed. In this manner, ink is directly transferred to the object to be printed from the surface of a projecting portion (image area) of the printing plate to form an image on the object to be printed.

In such a flexographic printing plate, it is known that ink transferability is deteriorated in the solid portion and thus the ink density is decreased depending on printing conditions such as printing pressure.

In order to solve such problems, JP2012-511175A discloses that grooves are regularly formed in a grid pattern in a halftone portion with a width having a diameter of 30 µm or more, and a solid portion using a lattice mask (refer to [claim 12], [claim 13], [claim 17], [FIG. 4A], and the like).

SUMMARY OF THE INVENTION

As a result of investigations on the printing plate disclosed in JP2012-511175A, the present inventors have found that there are cases where ink transferability is deteriorated in a solid portion and a region having a halftone dot area ratio of more than 90% (hereinafter, also abbreviated as a "solid portion and the like"), and moire, filling-up, or the like occurs in a region having a halftone dot area ratio of more than 30% and 90% or less (hereinafter, also abbreviated as a "halftone portion"), printing quality thus deteriorates. It has been found that moire tends to occur in a region having a halftone dot area ratio of more than 0% and 30% or less (A section), filling-up tends to occur in a region having a halftone dot area ratio of more than 30% and 70% or less (B section), and collapse tends to occur in a region having a halftone dot area ratio of more than 70% and 90% or less (C section) in the halftone portion.

An object of the present invention is to provide a flexographic printing plate having excellent ink transferability in a solid portion and the like and having good printing quality in a halftone portion.

As a result of conducting intensive investigations to achieve the above object, the present inventors have found that by providing two or more recessed portions having different depths to small dots in a halftone dot portion and a solid portion or to small dots in a halftone dot portion according to a halftone dot area ratio, excellent ink transferability is exhibited in a solid portion and the like and printing quality is improved in a halftone portion, and thus have completed the present invention.

That is, the present inventors have found that the above object can be achieved by adopting the following configurations.

[1] A flexographic printing plate comprising: a relief layer including a non-image area and an image area, in which the image area has a halftone dot portion having a halftone dot area ratio of more than 0% and less than 100%, and a solid portion having a halftone dot area ratio of 100%, small dots in the halftone dot portion and the solid portion or small dots in the halftone dot portion have two or more recessed portions having different depths according to a halftone dot area ratio, and the two or more recessed portions having different depths are recessed portions whose depth becomes deeper as the halftone dot area ratio increases.

[2] The flexographic printing plate according to [1], in which a depth of the recessed portion is 10 µm or less in a region having a halftone dot area ratio of more than 0% and 30% or less.

[3] The flexographic printing plate according to [1] or [2], in which a depth of the recessed portion is 15 µm or less in a region having a halftone dot area ratio of more than 30% and 70% or less.

[4] The flexographic printing plate according to any one of [1] to [3], in which a depth of the recessed portion is 9 µm or more and 18 µm or less in a region having a halftone dot area ratio of more than 70% and 90% or less.

[5] The flexographic printing plate according to any one of [1] to [4], in which a depth of the recessed portion is 11 µm or more and 23 µm or less in a region having a halftone dot area ratio of more than 90% and 100% or less.

[6] The flexographic printing plate according to any one of [1] to [5], in which the recessed portions are formed by grooves which are continuously formed in a direction orthogonal to a depth direction.

According to the present invention, it is possible to provide a flexographic printing plate having excellent ink transferability in a solid portion and the like and having good printing quality in a halftone portion.

DESCRIPTION OF THE PREFERRED EMBODIMENTS

Hereinafter, the present invention will be described in detail.

In the present invention, the notation "lower limit to upper limit", which expresses a numerical range, means "the lower limit or greater and the upper limit or less", and the notation "upper limit to lower limit" means "the upper limit or less and the lower limit or greater". That is, these are numerical ranges that include the upper limit and the lower limit.

In addition, the terms "parts by mass" and "% by mass" have the same meanings as the terms "parts by weight" and "% by weight", respectively.

Herein, regarding the description of a flexographic printing plate and a flexographic printing plate precursor, an uncrosslinked crosslinkable layer is referred to as "relief forming layer", a layer obtained by crosslinking the relief forming layer is referred to as "crosslinked relief forming layer", a layer in which unevenness is formed on the surface by laser engraving is referred to as "relief layer".

In addition, the crosslinking is carried out by heat and/or light, and the crosslinking is not particularly limited as long as it is a reaction by which the resin composition is cured.

Further, a printing plate precursor having a crosslinked relief forming layer is laser-engraved and rinsed as desired to produce a flexographic printing plate.

[Flexographic Printing Plate]

A flexographic printing plate of the present invention is a flexographic printing plate having a relief layer including a non-image area and an image area, and the image area has a halftone dot portion having a halftone dot area ratio of more than 0% and less than 100%, and a solid portion having a halftone dot area ratio of 100%.

In addition, small dots in the halftone dot portion and the solid portion, or small dots in the halftone dot portion have two or more recessed portions having different depths according to a halftone dot area ratio.

In addition, the two or more recessed portions having different depths are recessed portions whose depth becomes deeper as the halftone dot area ratio increases.

Here, the "halftone dot area ratio" is a ratio of a halftone dot area per unit area expressed as a percentage, and as described above, a portion having a halftone dot area ratio of 100% is referred to as a solid portion.

The flexographic printing plate of the present invention having such a configuration has excellent ink transferability in the solid portion and the like and has good printing quality in the halftone portion.

Although the details are not clear, the present inventors assume as follows.

The present inventors assume that the recessed portion has a function of increasing the ink holding amount and stabilizing flowing of ink (extrusion amount) during printing in a region having a halftone dot area ratio of more than 90% (solid portion and the like), and the recessed portion appropriately keeps the ink density in the halftone dot and contributes to ink dislocation between the halftone dots in a region having a halftone dot area ratio of more than 30% and 90% or less (halftone portion).

That is, it is considered that by providing the depth of a recessed portion in a region having a high halftone dot area ratio that is deeper than the depth of a recessed portion in a region having a low halftone dot area ratio, the above-described function becomes clear and thus both good ink transferability in the solid portion and the like and good printing quality in the halftone portion can be obtained.

Next, the entire configuration of the flexographic printing plate of the present invention (particularly, the recessed portions formed in the image area) will be described using FIGS. 1 to 5B and then each configuration will be described in detail.

Figure 1:
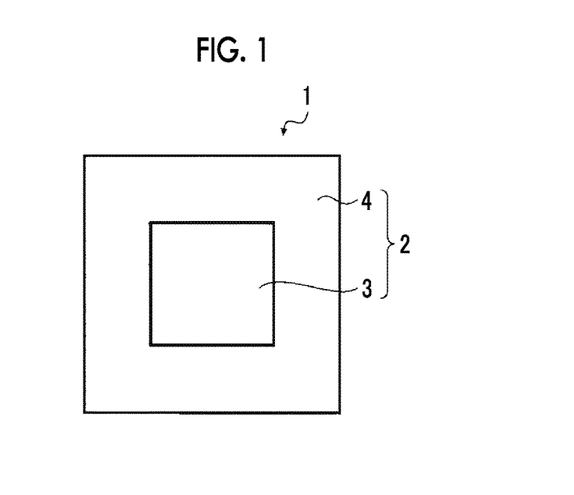
FIG. 1 is a schematic top view showing an example of a flexographic printing plate according to the present invention.

As shown in FIG. 1, a printing plate 1 as an example of the flexographic printing plate according to the present invention has a relief layer 2 on which an image area 3 and a non-image area 4 are formed.

The image area 3 is a region which is brought into contact with ink at the time of printing to transfer the ink to an object to be printed, that is, a region in which an image is formed at the time of printing. In addition, the non-image area 4 is a region which is not brought into contact with ink at the time of printing, that is, a region in which an image is not formed.

Figure 2:
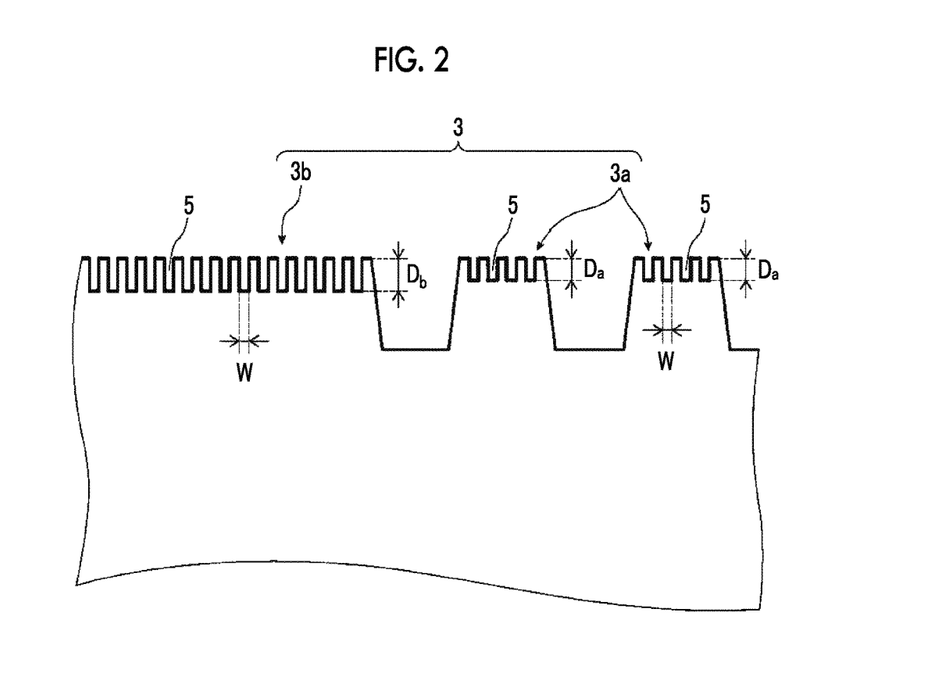
FIG. 2 is a schematic cross-sectional view showing a part of an image area of the flexographic printing plate in FIG. 1 in an enlarged manner.

As shown in FIG. 2, the image area 3 has a halftone dot portion 3a having a halftone dot area ratio of more than 0% and less than 100% and a solid portion 3b having a halftone dot area ratio of 100%.

In addition, as shown in FIG. 2, a depth Da of a recessed portion 5 at each small dot of the halftone dot portion 3a is different from a depth Db of a recessed portion 5 in the solid portion 3b, and the depth Db of the recessed portion 5 in the solid portion 3b having a high halftone dot area ratio is deeper than the depth Da of the recessed portion 5 at each small dot of the halftone dot portion 3a. The reference symbol W shown in FIG. 2 indicates the width of the recessed portion 5.

Here, in the aspect shown in FIG. 2, two or more recessed portions having different depths are provided in the halftone dot portion 3a and the solid portion 3b. However, the configuration is not limited to the aspect of the present invention shown in FIG. 2. For example, an aspect in which a depth A of a recessed portion of a small dot of a halftone dot portion in a region A having a predetermined halftone dot area ratio is different from a depth B of another recessed portion of a small dot of a halftone dot portion in a region B having another predetermined halftone dot area ratio, an aspect in which a depth A of a recessed portion in a region having a halftone dot area ratio of more than 90% (including a solid portion) is different from a depth B of another recessed portion of a small dot of a halftone dot portion in a region B having a halftone dot area ratio of less than 90%, and the like may be adopted.

Figure 3A:
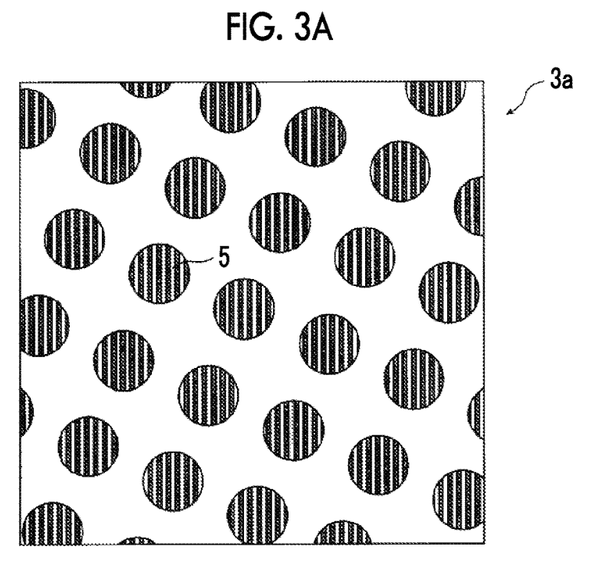
FIG. 3A is a plan view showing an example of a halftone dot portion having a halftone dot area ratio of 30%.
Figure 3B:
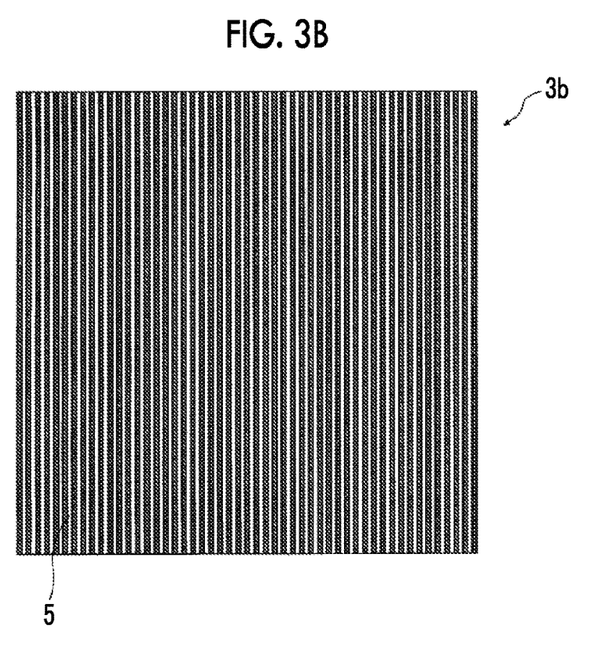
FIG. 3B is a plan view showing an example of a solid portion having a halftone dot area ratio of 100%.
Figure 4A:
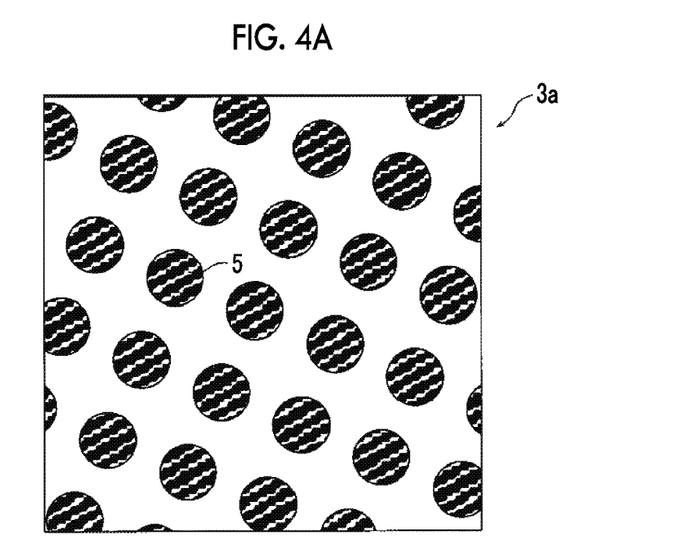
FIG. 4A is a plan view showing another example of the halftone dot portion having a halftone dot area ratio of 30%.
Figure 4B:
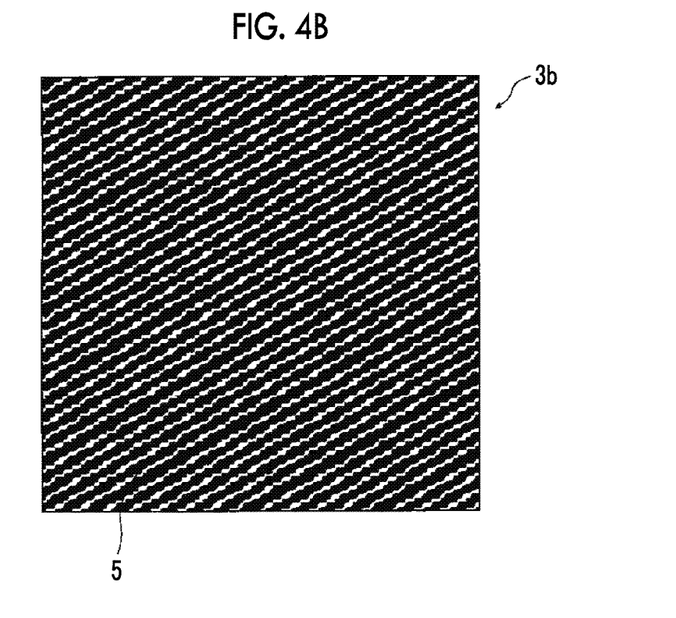
FIG. 4B is a plan view showing another example of the solid portion having a halftone dot area ratio of 100%.
Figure 5A:
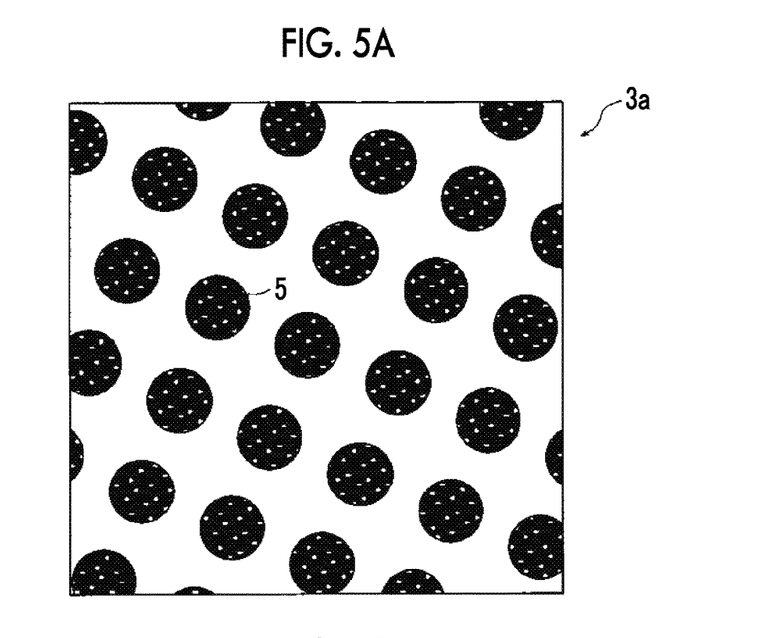
FIG. 5A is a plan view showing still another example of the halftone dot portion having a halftone dot area ratio of 30%.
Figure 5B:
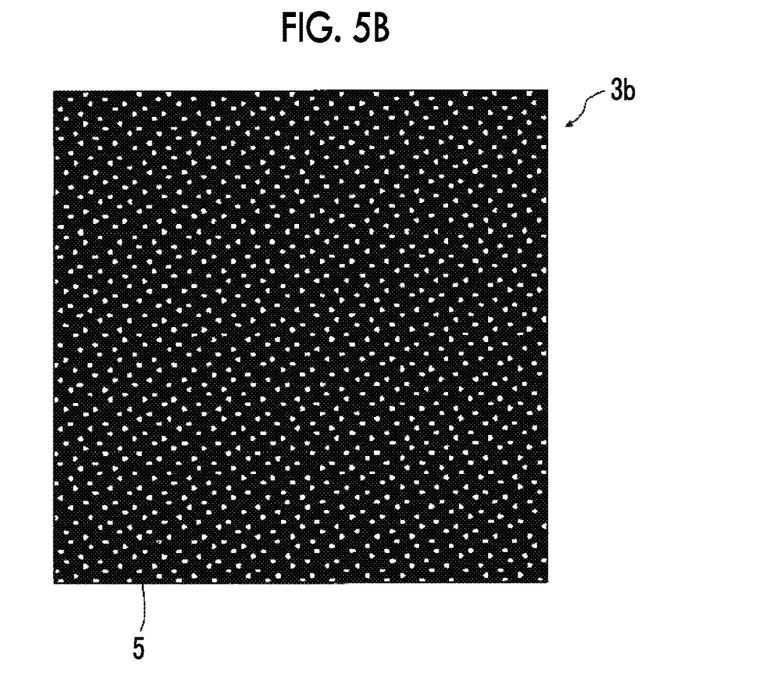
FIG. 5B is a plan view showing still another example of the solid portion having a halftone dot area ratio of 100%.

As shown in plan views of FIGS. 3A and 3B, 4A and 4B, and 5A and 5B, the shape of the recessed portion 5 may be a groove shape in which the recessed portions are continuously provided (refer to FIGS. 3A and 3B, and 4A and 4B), or may be a porous shape the recessed portions are not continuously provided (refer to FIGS. 5A and 5B).

In addition, all of FIGS. 3A, 4A, and 5A show an aspect in which each small dot in the halftone dot portion having a halftone dot area ratio of 30% has a recessed portion, and all of FIGS. 3B, 4B, and 5B show an aspect in which the solid portion having a halftone dot area ratio of 100% has recessed portions.

[Non-Image Area]

The non-image area of the flexographic printing plate of the present invention is a region to which ink is not applied at the time of printing as described above, that is, a region which does not form an image. Since regions other than the halftone dots in the halftone dot portion of the image area described later are regions for forming a bright (highlight) image, the regions are not included in the non-image area.

The shape of the non-image area is not particularly limited and the area other than the image area is the non-image area.

[Image Area]

The image area of the flexographic printing plate of the present invention is a region to which ink is applied at the time of printing and from which the ink is transferred to an object to be printed as described above, that is, a region which forms an image at the time of printing.

In the present invention, the image area has the halftone dot portion having a halftone dot area ratio of more than 0% and less than 100% and the solid portion having a halftone dot area ratio of 100%, and has recessed portions, which will be described later, on at least a part of a surface thereof.

Generally, the small dots constituting the halftone dot portion are formed based on a predetermined number of screen lines (definition), for example, based on the number of screen lines of about 100 to 200 lines per inch (lpi).

In addition, the size of the small dot constituting the halftone dot portion changes depending on the halftone dot area ratio and the number of screen lines and thus is not particularly limited. For example, in a case where the number of screen lines of circular dots is 150 lpi and the halftone dot area ratio is 70%, the diameter of the small dot can be calculated as 160 μm.

<Recessed Portion>

The recessed portion is a recessed portion which is provided at the small dot in the halftone dot portion and the solid portion or at the small dot in the halftone dot portion.

In the present invention, two or more recessed portions, preferably three or more recessed portions, and more preferably four or more recessed portions at the small dot in the halftone dot portion and the solid portion or at the small dot in the halftone dot portion according to the halftone dot area ratio such that as the halftone dot area ratio becomes higher, the depth becomes deeper.

The depth of the recessed portion (a portion indicated by reference symbol Da in FIG. 2) at the small dot in the halftone dot portion and the solid portion or at the small dot in the halftone dot portion is changed according to the halftone dot area ratio such that as the halftone dot area ratio increases, the depth becomes deeper.

Here, from the viewpoint of further suppressing the occurrence of moire, in a region having a halftone dot area ratio of more than 0% and 30% or less (hereinafter, also referred to as "A section"), the depth of the recessed portion is preferably 10 μm or less and more preferably 8 μm or less.

In addition, from the view point of further suppressing the occurrence of halftone dot filling-up, in a region having a halftone dot area ratio of more than 30% and 70% or less (hereinafter, also referred to as "B section"), the depth of the recessed portion is preferably 15 μm or less and more preferably 8 μm or more and 12 μm or less.

Further, the view point of further suppressing halftone dot collapse, in a region having a halftone dot area ratio more than 70% and 90% or less (hereinafter, also referred to as "C section"), the depth of the recessed portion is preferably 9 μm or more and 18 μm or less and more preferably 12 μm or more and 16 μm or less.

Further, the view point of further improving ink transferability, in a region having a halftone dot area ratio of more than 90% and 100% or less (hereinafter, also referred to as "D section"), the depth of the recessed portion is preferably 11 μm or more and 23 μm or less and more preferably 18 μm or more and 22 μm or less.

In the above preferable ranges of the depth of the recessed portion, there are partially overlapped numerical values in each region, but this does not mean that adopting the depth of the same value is not allowed in each region.

In the present invention, as long as the depths of the recessed portions in at least two sections among the A to D sections described above vary according to the halftone dot area ratio, on other sections, the depths of the recessed portions may be the same or the recessed portion may not be provided.

Specifically, for example, the above-described C and D sections, as long as the depth of the recessed portion of the D section is deeper than the depth of the recessed portion of the C section, the depths of the recessed portions in the A and B sections may be the same as the depths of the recessed portions in the C section, or may be the same with a value shallower than the depth of the recessed portions in the C section, or the recessed portion may not be provided in the A and/or B section.

In addition, in the present invention, as long as the depths of the recessed portions in at least three sections among the A to D sections described above preferably vary according to the halftone dot area ratio, and the depths of the recessed portions in all of four sections more preferably vary according to the halftone dot area ratio.

For the reason that printing can be performed at a higher ink density by smoothly transferring ink to an object to be printed, the width of the recessed portion (a portion indicated by symbol W in FIG. 2) is preferably 5 to 30 μm and the recessed portion is preferably a groove having a width of 10 to 25 μm.

For the same reason, the pitch of the recessed portion, that is, a distance between the centers of adjacent recessed portions is preferably 10 to 100 μm and the recessed portion is preferably a groove having a pitch of 20 to 60 μm.

In addition, for the reason that printing can be performed at a higher ink density by smoothly transferring ink to an object to be printed, the recessed portions are preferably grooves that are continuously formed in a direction orthogonal to the depth direction.

<Specific Surface Area>

Since the image area changes depending on the pitch of the above-described recessed portion or the like, the specific surface area is not particularly limited. However, by providing the above-described recessed portion, the specific surface area, that is, a ratio of a surface area (actual area) with respect to a measurement area (geometric measurement area) is about 1.5 times to 3.5 times.

Here, the specific surface area is a value measured using a 3-dimensional laser microscope VK-8700 (magnification of objective lens: 20 times, manufactured by KEYENCE Inc.), and shape-analyzed using shape analysis application (VK Analyzer, manufactured by KEYENCE Inc.).

[Support]

The flexographic printing plate of the present invention may have a support on a rear surface of the relief layer (the surface on the opposite to an engraved surface).

Although such a support is not particularly limited, a support having high dimensional stability is preferably used. Examples thereof include polyester (for example, polyethylene terephthalate (PET), polybutylene terephthalate (PBT), polyethylene naphthalate (PEN)); polyacrylonitrile (PAN); polyimide (PI); polyamide (PA); fluororesin such as Teflon (registered trademark); plastic resin such as silicone resin or polyvinyl chloride; synthetic rubber such as styrene-butadiene rubber; and plastic resin reinforced with glass fibers (such as epoxy resin or phenol resin).

As the support, a PET film, a PEN film, a PI film, a PA film, a fluororesin film, or a silicone resin film is preferably used.

[Method for Manufacturing Flexographic Printing Plate]

The method for manufacturing the above-described flexographic printing plate of the present invention (hereinafter, also simply referred to as "manufacturing method of the present invention") includes a layer forming step of forming a relief forming layer by using a resin composition for laser engraving, a crosslinking step of crosslinking the relief forming layer to obtain a flexographic printing plate precursor having a crosslinked relief forming layer, and an engraving step of performing laser engraving on the crosslinked relief forming layer to form the relief layer including the non-image area and the image area having the recessed portion formed thereon, thereby obtaining a flexographic printing plate.

Hereinafter, each step of the manufacturing method of the present invention will be described in detail.

[Layer Forming Step]

The layer forming step is a step of forming a relief forming layer before crosslinking (before curing) by using a resin composition for laser engraving (hereinafter, also simply referred to as "resin composition").

<Resin Composition>

As the resin composition, a known resin composition in the related art for forming a relief forming layer of a flexographic printing plate precursor can be used, and for example, a resin composition containing a diene-based polymer, a thermal polymerization initiator, and carbon black may be used.

Next, each component contained in the resin composition used in the layer forming step will be described.

(Diene-Based Polymer)

The diene-based polymer is not particularly limited and any known diene-based polymer in the related art can be used without limitations.

Specific examples of the diene-based polymer include polyisoprene, polybutadiene, an ethylene-propylene-diene copolymer (EPDM), an acrylonitrile-butadiene copolymer, a styrene-butadiene copolymer (SBR), a styrene-isoprene copolymer, and a styrene-isoprene-butadiene copolymer, and these may be used singly or in combination of two or more kinds thereof.

Among these, for the reason that the variation in the film thickness of the relief forming layer is decreased, the diene-based polymer is preferably at least one diene-based polymer selected from the group consisting of polyisoprene, polybutadiene, and an ethylene-propylene-diene copolymer.

In the present invention, the weight-average molecular weight of the diene-based polymer is preferably 200,000 or more, more preferably 300,000 to 2,000,000, even more preferably 300,000 to 1,500,000, and particularly preferably 300,000 to 700,000 from the viewpoint of the tensile strength of the relief forming layer.

Here, the weight-average molecular weight can be determined by measuring the molecular weight by gel permeation chromatography (GPC) and calculating the weight-average molecular weight relative to polystyrene standards. Specifically, for example, regarding GPC, HLC-8220GPC (manufactured by Tosoh Corporation) is used, and three columns of TSKgeL Super HZM-H, TSKgeL Super HZ4000, and TSKgeL SuperHZ2000 (manufactured by Tosoh Corporation, 4.6 mm ID×15 cm) are used, while tetrahydrofuran (THF) is used as an eluent. Further, regarding the conditions, GPC is performed using an IR detector under the conditions of a sample concentration of 0.35% by mass, a flow rate of 0.35 mL/min, a sample injection amount of 10 μL, and a measurement temperature of 40° C. Also, the detection curve is produced using eight samples of "standard sample TSK standard, polystyrene": "F-40", "F-20", "F-4", "F-1", "A-5000", "A-2500", "A-1000", and "n-propylbenzene".

The content of the diene-based polymer in the resin composition is preferably 5% to 90% by mass, more preferably 15% to 85% by mass, and even more preferably 30% to 85% by mass with respect to the total solid content. In the case in which the content of the diene-based polymer is in the above range, a relief layer having further excellent rinsability of the engraving residue and excellent ink transferability may be obtained, which is preferable.

(Thermal Polymerization Initiator)

The thermal polymerization initiator is not particularly limited, and any known thermal polymerization initiator in the related art (for example, a radical polymerization initiator) can be used without limitations.

Specific examples of the thermal polymerization initiator include: (a) an aromatic ketone, (b) an onium salt compound, (c) an organic peroxide, (d) a thio compound, (e) a hexaarylbiimidazole compound, (f) a keto oxime ester compound, (g) a borate compound, (h) an azinium compound, (i) a metallocene compound, (j) an active ester compound, (k) a compound having a carbon-halogen bond, and (l) an azo-based compound, and these may be used singly or in combination of two or more kinds thereof.

Among these, for the reason that the half-life temperature is high, and consequently scorching (early curing) at the time of kneading of the resin composition can be suppressed, or for the reason that satisfactory engraving sensitivity is obtained, and a satisfactory relief edge shape is obtained in the case in which the resin composition is applied to the relief forming layer of the flexographic printing plate precursor, the (c) organic peroxide is particularly preferable.

Here, regarding the (a) aromatic ketone, (b) onium salt compound, (d) thio compound, (e) hexaarylbiimidazole compound, (f) keto oxime ester compound, (g) borate compound, (h) azinium compound, (i) metallocene compound, (j) active ester compound, (k) compound having a carbon-halogen bond, and (l) azo-based compound, the compounds described in paragraphs "0074" to "0118" of JP2008-63554A can be preferably used.

On the other hand, regarding the (c) organic peroxide mentioned as suitable examples, the compounds described below are preferable.

Specific examples of the organic peroxide include dicumyl peroxide (10-hour half-life temperature: 116° C.), α,α'-di(t-butylperoxy)diisopropylbenzene (10-hour half-life temperature: 119° C.), and 2,5-dimethyl-2,5-di(t-butylperoxy)hexane (10-hour half-life temperature: 118° C.), and these may be used singly or in combination of two or more kinds thereof.

In the present invention, regarding the form of the organic peroxide, the organic peroxide can be used as a technical product as it is; however, from the viewpoint of handleability problems (hazardousness, workability, and the like), a dilution product at a concentration of 40 wt % (non-hazardous, powdered) in which a technical product is adsorbed to an inorganic filler such as calcium carbonate, or a master batch type dilution product intended to prevent dusting at the time of kneading and to improve dispersibility in the polymer, can be more preferably used.

Regarding the technical product, for example, PERCUMYL D (manufactured by NOF Corporation), PERKADOX BC-FF (manufactured by Kayaku Akzo Corporation), LUPEROX DC (manufactured by Arkema Yoshitomi, Ltd.), PERBUTYL P (manufactured by NOF Corporation), PERKADOX 14 (manufactured by Kayaku Akzo Corporation), LUPEROX F (manufactured by Arkema Yoshitomi, Ltd.), LUPEROX F90P (manufactured by Arkema Yoshitomi, Ltd.), PERHEXA 25B (manufactured by NOF Corporation), KAYAHEXA AD (manufactured by Kayaku Akzo Corporation), and LUPEROX 101 (manufactured by Arkema Yoshitomi, Ltd.) can be used; however, the examples are not intended to be limited to these.

Furthermore, examples of dilution products include PERCUMYL D-40 (manufactured by NOF Corporation; inert filler dilution product), PERCUMYL D-40MB (manufactured by NOF Corporation; dilution product of silica/polymer and others), KAYACUMYL D-40C (manufactured by Kayaku Akzo Corporation; calcium carbonate dilution product), KAYACUMYL D-40MB-S (manufactured by Kayaku Akzo Corporation; rubber master batch), KAYACUMYL D-40MB (manufactured by Kayaku Akzo Corporation; rubber master batch), PERBUTYL P-40 (manufactured by NOF Corporation; inert filler dilution product), PERBUTYL P-40MB (manufactured by NOF Corporation; dilution product of silica/polymer and others), PERKADOX 14/40 (manufactured by Kayaku Akzo Corporation; calcium carbonate dilution product), PERKADOX 14-40C (manufactured by Kayaku Akzo Corporation; calcium carbonate dilution product), LUPEROX F40 (manufactured by Arkema Yoshitomi, Ltd.), PERHEXA 25B-40 (manufactured by NOF Corporation; dilution product of silica and others), KAYAHEXA AD-40C (manufactured by Kayaku Akzo Corporation; calcium silicate dilution product), TRIGONOX 101-40MB (manufactured by Kayaku Akzo Corporation; rubber master batch), and LUPEROX 101XL (manufactured by Arkema Yoshitomi, Ltd.) can be used; however, the examples are not intended to be limited to these.

In the present invention, the amount of the thermal polymerization initiator is preferably 0.1 to 20.0 parts by mass, more preferably 0.5 to 15.0 parts by mass, and even more preferably 1.0 to 15.0 parts by mass with respect to 100 parts by mass of the diene-based polymer for the reason that excellent rinsability of the engraving residue and satisfactory printing durability and ink receptivity are obtained.

(Carbon Black)

The carbon black included is not particularly limited, and as long as dispersibility thereof in the resin composition and the like are stable, any carbon black can be used regardless of the classification by American Society for Testing and Materials (ASTM) and the applications (for example, color applications, rubber applications, and battery applications).

Here, in the present invention, it is considered that carbon black functions as a photothermal conversion agent that accelerates thermal decomposition of a cured product at the time of laser engraving by absorbing laser light and generating heat.

Specific examples of carbon black include furnace black, thermal black, channel black, lamp black, and acetylene black, and these may be used singly or in combination of two or more kinds thereof.

Meanwhile, these carbon blacks can be used as color chips or color pastes, in which carbon blacks have been dispersed in nitrocellulose, a binder or the like in advance using a dispersant as necessary to facilitate dispersion. However, from the viewpoint of cost, it is preferable to use carbon blacks as powders.

In the present invention, the content of carbon black is preferably 1 to 30 parts by mass, more preferably 2 to 25 parts by mass, and particularly preferably 3 to 20 parts by mass with respect to 100 parts by mass of the diene-based polymer for the reason that satisfactory sensitivity is obtained at the time of laser engraving, and satisfactory ink receptivity is obtained.

(Other Additives)

In the resin composition used in the layer forming step, various known additives can be appropriately incorporated to the extent that the effects of the present invention are not impaired. Examples thereof include a crosslinking aid, a silane coupling agent, another filler, a wax, a process oil, a metal oxide, an ozone decomposition preventing agent, an aging inhibitor, a polymerization inhibitor and a colorant, and these may be used singly or in combination of two or more kinds thereof.

(Formation Method)

Figure 6:
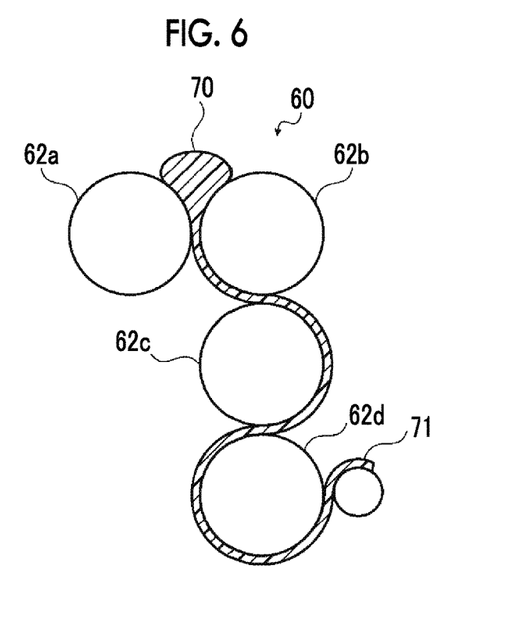
FIG. 6 is a view conceptually showing a calender roll for producing a flexographic printing plate precursor.

As a method for forming the relief forming layer, for example, a method including preparing a resin composition, removing a solvent from the resin composition as required, and then melting and extruding the resin composition on a support; a method including a preparing a resin composition, casting the resin composition on a support, and heating and drying the resin composition in an oven or the like to remove a solvent; a method including molding a resin composition into a sheet shape using a calender roll as shown in FIG. 6, or the like can be suitably used.

In FIG. 6, a calender roll 60 has first roll 62a to fourth roll 62d, and intervals of these rolls, the temperature of these rolls, and the rotation speed of these rolls can be set.

A sheet-like uncured layer 71 can be obtained by setting a kneaded product 70 of the resin composition between the rolls and rolling and molding the material.

[Crosslinking Step]

The crosslinking step is a step of crosslinking the relief forming layer formed in the above layer forming step to form a crosslinked relief forming layer.

Herein, the crosslinking method is not particularly limited as long as the method is a method for curing the relief forming layer by light and/or heat. Curing methods used in methods for manufacturing a flexographic printing plate precursor in the related art can be appropriately used.

(Photocuring)

In a case where the relief forming layer contains a photopolymerization initiator, the relief forming layer can be crosslinked by irradiating the relief forming layer with light (hereinafter, also referred to as "actinic ray") which becomes a trigger for the photopolymerization initiator.

The irradiation with the actinic ray is generally performed over the entire surface of the relief forming layer.

Examples of the actinic ray include visible light, ultraviolet light, and an electron beam but ultraviolet light is most generally used. In a case where a base material side for fixing a relief forming layer such as a support of the relief forming layer is taken as a rear surface, only a front surface of the support may be irradiated with light. However, it is preferable to perform irradiation with light from the rear surface as well as from the front surface in a case where the support is a transparent film which transmits an actinic ray. In a case where a protective film is present, the irradiation from the front surface may be performed with the protective film being provided, or may be performed after the protective film is removed. Since there is a concern of causing a polymerization inhibition under the presence of oxygen, the irradiation with actinic ray may be performed after coating the relief forming layer with a vinyl chloride sheet under vacuum.

(Thermosetting)

In a case where the relief forming layer contains a thermal polymerization initiator, the relief forming layer can be crosslinked by heating.

As heating means for performing crosslinking by heat, a method of heating an uncured layer in a hot air oven or a far-infrared oven for a predetermined period of time and a method of bringing a heated roll into contact with an uncured layer for a predetermined period of time may be used.

As the method for curing the relief forming layer, the relief forming layer is preferably crosslinked by heat from the viewpoint that uniform curing (crosslinking) is possible from the surface to the inside.

In a case where the relief forming layer is crosslinked by heat, there are advantages in that, first, a relief formed after laser engraving is made sharp and, second, the stickiness of engraving residue generated during the laser engraving is suppressed.

[Engraving Step]

The engraving step is a step of forming a relief layer including a non-image area and an image area having the above-described recessed portion formed on the surface, that is, an image area in which two or more recessed portions having different depths are provided at small dots in the halftone dot portion and the solid portion or at small dots in the halftone dot portion according to the halftone dot area ratio, by performing laser engraving on the crosslinked relief forming layer which is crosslinked in the above crosslinking step.

The laser engraving method is not particularly limited. However, in the manufacturing method of the present invention, it is required to perform engraving on a portion which becomes the non-image area (to form the non-image area) and to form the above-described recessed portion on the surface of the image area. Thus, a method of controlling a laser head by a computer based on digital data of a desired image and performing scanning and irradiation on the crosslinked relief forming layer is preferably used.

(Image Data Generation Method)

As the method for generating image data for laser engraving, the following method can be used.

First, original image data of a printing plate to be produced is obtained. Next, in order to convert the original image data into data for performing laser engraving, processing using Raster Image Processor (RIP) is performed. On the other hand, by rasterizing the original image data, a plurality of partial regions having a predetermined width measured from the outer periphery (edge) of each image area is extracted. On each of the extracted partial regions, a template having recessed patterns with a predetermined area ratio is superimposed, thereby forming a mask. Further, the image data which had been subjected to RIP processing (binary image) is multiplied by the generated mask to generate output image data (light quantity image).

Here the depth of the recessed portion can be adjusted by shape profiling in a case where a light quantity image is formed, for example, by setting laser power and the rotating speed of a drum according to a DEPTH POWER value (DP value) set in relation to engraving depth.

In this manner, the output image data is generated by adding the recessed patterns to the image area of the original image data, and laser engraving is performed using the output image data to produce a flexographic printing plate.

(Laser Engraving)

As the method for laser engraving, for example, a method in which a sheet-like printing plate precursor for laser engraving is twined around the outer peripheral surface of a drum having a cylindrical shape, the drum is rotated, an exposure head is caused to perform scanning on the printing plate precursor in a sub-scanning direction orthogonal to a main scanning direction at a predetermined pitch by emitting laser light according to the output image date from the exposure head to the printing plate precursor such that a two-dimensional image is engraved (recorded) on the surface of the printing plate precursor at a high speed, and the like can be used.

The kind of laser used in the laser engraving is not particularly limited but infrared laser is preferably used. In a case where irradiation is performed with infrared laser, the molecules in the crosslinked relief forming layer are vibrated to generate heat. In a case where high output laser such as carbon dioxide gas laser or yttrium aluminum garnet (YAG) laser is used as infrared laser, a large amount of heat is generated in the laser irradiation portion, the molecules in the cured layer are cut or ionized, and thereby, selective removal, that is, engraving is implemented.

From the viewpoint of productivity, costs and the like, as infrared laser, carbon dioxide gas laser ($CO_2$ laser) or semiconductor laser is preferable, and semiconductor infrared laser with fiber (FC-LD) is particularly preferable. Generally, semiconductor laser has a higher efficiency of laser oscillation, and is inexpensive as compared with $CO_2$ laser, and can be miniaturized. In addition, since the semiconductor laser is small, it may be easily arrayed. Further, the shape of a beam can be easily controlled by treatment of the fiber.

With regard to the semiconductor laser, one having a wavelength of 700 to 1,300 nm is preferable, one having a wavelength of 800 to 1,200 nm is more preferable, one having a wavelength of 860 to 1,200 nm is future preferable, and one having a wavelength of 900 to 1,100 nm is particularly preferable.

In addition, the semiconductor infrared laser with fiber can output laser light efficiently by being equipped with optical fiber, and thus this is effective in the laser engraving. Further, the shape of the beam can be controlled by treatment of the fiber. For example, the beam profile may be a top hat shape, and energy can be applied stably to the plate surface. The details of semiconductor lasers are described in "Laser Handbook 2nd Edition" edited by The Laser Society of Japan, "Applied Laser Technology" edited by The Institute of Electronics and Communication Engineers of Japan., etc.

Moreover, plate producing apparatuses including semiconductor laser constituted of fiber described in detail in JP2009-172658A and JP2009-214334A can be suitably used for the method for manufacture a flexographic printing plate of the present invention.

[Rinsing Step]

The manufacturing method of the present invention may include a rinsing step of rinsing the engraved surface with an aqueous alkali solution, after the engraving step. By providing the rinsing step, the engraving residue adhering to and remaining on the engraved surface can be removed by washing away.

Examples of the means for rinsing include a method of immersing the printing plate in an aqueous alkali solution; a method of rotating the rinsing liquid or rubbing the engraved surface with a brush (for example, an animal hair brush such as a waved brush having a hair diameter of 100 to 500 μm), while immersing the printing plate in an aqueous alkali solution; a method of spraying an aqueous alkali solution; and a method of rubbing the engraved surface with a brush mainly in the presence of an aqueous alkali solution, using a batch type or conveyor type brush washing machine which is known as a developing machine for photosensitive resin letterpress plates. In the case in which the slime of the engraving residue cannot be removed, a rinsing liquid containing soap or a surfactant may be used.

[Drying Step]

In the manufacturing method of the present invention, in the case of performing the rinsing step of rinsing the engraved surface, after the engraving step, a drying step of volatilizing the rinsing liquid by drying the engraved relief forming layer may be added.

[Post-Crosslinking Step]

In the manufacturing method of the present invention, as required, after the engraving step, a post-crosslinking step of further crosslinking the relief layer may be added. By carrying out a post-crosslinking step, which is an additional crosslinking step, it is possible to further strengthen the relief formed by engraving.

In the present invention, laser engraving is not limited to the above-described laser engraving (direct laser engraving (DLE) method) and various known manufacturing methods such as a laser ablation masking system (LAMS) of writing and developing an image on a surface of a printing plate precursor with laser can be used.

Specifically, as LAMS, methods disclosed in WO2004/090638A, JP2014-063132A, and the like.

[Flexographic Printing Apparatus]

Next, the configuration of a flexographic printing apparatus using the above-described flexographic printing plate according to the present invention will be described in detail. The flexographic printing apparatus has the same configuration as a flexographic printing apparatus of the related art except that the above flexographic printing plate is used.

Figure 7:
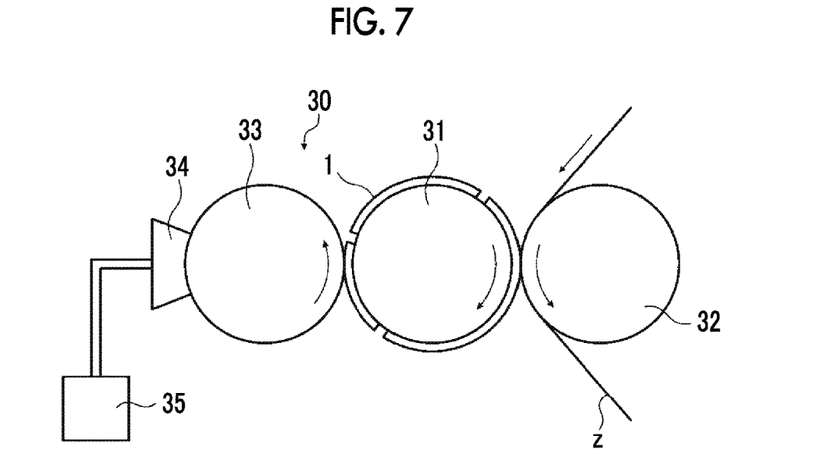
FIG. 7 is a view conceptually showing a main part of a flexographic printing apparatus using the flexographic printing plate according to the present invention.

FIG. 7 is a view conceptually showing the main part of a flexographic printing apparatus using the flexographic printing plate according to the present invention.

As shown in FIG. 7, a flexographic printing apparatus 30 has the flexographic printing plate 1, a drum (plate cylinder) 31, a transport roller (impression cylinder) 32, an anilox roller 33, a doctor chamber 34, and a circulation tank 35.

The drum 31 has a cylindrical shape, and the flexographic printing plate 1 is placed onto the peripheral surface thereof. While rotating, the drum 31 brings the flexographic printing plate 1 into contact with an object to be printed z.

The transport roller 32 is a roller constituting a transport portion (not shown in the drawing) which transports the object to be printed z along a predetermined transport path. The transport roller 32 is arranged such that the peripheral surface thereof faces the peripheral surface of the drum 31, and brings the object to be printed z into contact with the flexographic printing plate 1.

The drum 31 is arranged such that the rotation direction thereof becomes identical to the transport direction of the object to be printed z.

The anilox roller 33, the doctor chamber 34, and the circulation tank 35 are portions for supplying ink to the flexographic printing plate 1. The circulation tank 35 stores ink, and the ink in the circulation tank 35 is supplied to the doctor chamber 34 by a pump (not shown in the drawing). The doctor chamber 34 is arranged to come into close contact with the surface of the anilox roller 33 and holds ink in the inside thereof. The anilox roller 33 rotates in synchronization with the drum 31 in a state of abutting on the peripheral surface of the drum 31, such that the printing plate 1 is coated (supplied) with the ink in the doctor chamber 34.

While transporting the object to be printed z along a predetermined transport path, the flexographic printing apparatus 30 having the above configuration rotates the flexographic printing plate 1 placed onto the drum 31 and transfers the ink to the object to be printed z, thereby performing printing. That is, the rotation direction of the drum onto which the flexographic printing plate is placed becomes the printing direction.

The kind of the object to be printed used in the flexographic printing apparatus using the flexographic printing plate of the present invention is not particularly limited and various known objects to be printed used in general flexographic printing apparatuses, such as paper, films, and cardboards, can be used.

In addition, the kind of the ink used in the flexographic printing apparatus using the flexographic printing plate of the present invention is not particularly limited and various known inks used in general flexographic printing apparatuses, such as an aqueous ink, an ultraviolet (UV) ink, an oil ink, and an electron beam (EB) ink, can be used.

EXAMPLES

Hereinafter, the present invention will be more specifically described based on Examples. Any materials, amount of use, ratio, details of processing, procedures of processing and the like shown in Examples may appropriately be modified without departing from the spirit of the present invention. Therefore, it is to be understood that the scope of the present invention should not be interpreted in a limited manner based on the specific examples shown below.

Example 1

<Preparation of Resin Composition A>

80 parts by mass of EPDM: MITSUI EPT1045 (ethylene-propylene-diene copolymer, ethylene content: 58% by mass, diene content: 5% by mass, kind of diene: dicyclopentadiene (DCPD), manufactured by Mitsui Chemicals, Inc.) as a polymer, 12 parts by mass of carbon black #45L (nitrogen adsorption specific surface area: 125 $m^2/g$, DBP absorption: 45 $cm^3$/100 g, manufactured by Mitsubishi Chemical Corporation.) as a photothermal converting agent, and 5 parts by mass of PERCUMYL D40 (dicumyl peroxide (40% by mass), manufactured by NOF CORPORATION) were kneaded to prepare a resin composition A. In the following first table, the formulation using the resin composition A is expressed as "Formulation A", and cases of using resin compositions B to F described later are expressed as "Formulations B to F" respectively.

<Production of Flexographic Printing Plate Precursor>

The obtained resin composition A was crosslinked by heating at a pressure of 10 MPa and 160° C. for 20 minutes using a heating press machine (MP-WCL, manufactured by Toyo Seiki Seisaku-sho, Ltd.) and thus a crosslinked relief forming layer having a thickness of 915 µm was produced.

A photocurable composition (3030, manufactured by Three Bond Co., Ltd.) was applied to one side of the obtained crosslinked relief forming layer so as to have an average film thickness of 100 µm and then a PET film having a thickness of 125 µm, as the support, was laminated thereon by using a nip roller. After 20 seconds, the photocurable layer was cured by a UV exposure machine (UV exposure machine ECS-151U, manufactured by EYE GRAPHICS Co., Ltd., metal halide lamp, 1,500 mJ/cm$^2$, exposed for 14 sec) from the PET film, thereby obtaining a flexographic printing plate precursor.

<Production of Flexographic Printing Plate>

A flexographic printing plate having an image area and a non-image area was formed by performing laser engraving on the crosslinked relief forming layer of the obtained flexographic printing plate precursor. In the following first table, a DLE method by laser engraving is expressed as "Method 1".

By performing laser engraving on the crosslinked relief forming layer of the flexographic printing plate precursor obtained above, a flexographic printing plate having an image area in which the depth of the recessed portion in each section has the value shown in the following first table, and a non-image area was prepared.

Specifically, engraving by irradiation with laser was performed using a laser engraving machine (1300S, manufactured by Hell Gravure Systems) under the conditions of a resolution of 2,540 dpi. Then, a cleaning agent (2% aqueous solution of JOY (registered trademark), manufactured by The Procter & Gamble Company) was dropped onto the plate and rubbed with a pig bristle brush, and the plate was washed with flowing water to remove the engraving residue.

In addition, as a pattern for forming the recessed portion in the image area (recessed portion forming pattern), engraving points were set at positions in which lattice points having equal intervals of a horizontal pitch xp (pix) and a vertical pitch yp (pix) were rotated at a (deg) in a counterclockwise direction to produce a mask pattern. The results calculated according to parameters while setting the parameter to a real number are converted into integers and used as coordinates of the engraving points.

The recessed portion forming patterns in the following first table are Patterns I to III respectively set to have the horizontal pitch xp (pix), the vertical pitch yp (pix), and a (deg) shown in the following second table. Here, plan views showing a halftone dot portion having a halftone dot area ratio of 30% and a solid portion in the surface of the image area obtained using Pattern I are as shown in FIGS. 3A and 3B, plan views showing a halftone dot portion having a halftone dot area ratio of 30% and a solid portion in the surface of the image area obtained using Pattern II are as shown in FIGS. 4A and 4B, and plan views showing a halftone dot portion having a halftone dot area ratio of 30% and a solid portion in the surface of the image area obtained using Pattern III are as shown in FIGS. 5A and 5B.

Examples 2 to 13 and Comparative Examples 1 to 3

Flexographic printing plates were manufactured in the same manner as in Example 1 except that the depth of the recessed portion in each section was set to the value shown in the following first table.

Example 14

A flexographic printing plate was manufactured in the same manner as in Example 1 except that as the recessed portion forming pattern, instead of Pattern I, Pattern II was used.

Example 15

A flexographic printing plate was manufactured in the same manner as in Example 1 except that as the recessed portion forming pattern, instead of Pattern I, Pattern III was used.

Example 16

A flexographic printing plate was manufactured in the same manner as in Example 1 except that instead of the resin composition A, a resin composition B (Formulation B) shown below was used.

<Preparation of Resin Composition B>

A resin composition A was prepared in the same manner as the preparation of the resin composition A except that carbon black #1000 (nitrogen adsorption specific surface area: 180 m$^2$/g, DBP absorption: 56 cm$^3$/100 g, manufactured by Mitsubishi Chemical Corporation) was used instead of carbon black #45L.

Example 17

A flexographic printing plate was manufactured in the same manner as in Example 1 except that instead of the resin composition A, a resin composition C (Formulation C) shown below was used.

<Preparation of Resin Composition C>

A resin composition C was prepared in the same manner as in the preparation of the resin composition A except that F-200 (nitrogen adsorption specific surface area: 51 m$^2$/g, DBP absorption: 180 cm$^3$/100 g, manufactured by ASAHI CARBON CO., LTD.) was used instead of carbon black #45L.

Example 18

A flexographic printing plate was manufactured in the same manner as in Example 1 except that instead of the resin composition A, a resin composition D (Formulation D) shown below was used.

<Preparation of Resin Composition D>

A resin composition D was prepared in the same manner as in the preparation of the resin composition A except that SEAST FM (nitrogen adsorption specific surface area: 42 m$^2$/g, DBP absorption: 160 cm$^3$/100 g, manufactured by Tokai Carbon Co., Ltd.) was used instead of carbon black #45L.

Example 19

A flexographic printing plate was manufactured in the same manner as in Example 1 except that instead of the resin composition A, a resin composition E (Formulation E) shown below was used.

<Preparation of Resin Composition E>

80 parts by mass of UBEPOL BR150 (polybutadiene, manufactured by Ube Industries, Ltd.) as a polymer, 12 parts by mass of carbon black #45L (nitrogen adsorption specific surface area: 125 m$^2$/g, DBP absorption: 45 cm$^3$/100 g, manufactured by Mitsubishi Chemical Corporation) as a photothermal converting agent, and 5 parts by mass of PERCUMYL D40 (dicumyl peroxide (40% by mass), manufactured by NOF CORPORATION) were kneaded to prepare a resin composition E.

Example 20

<Preparation of Resin Composition F>

60 parts by mass of KRATON D-1102 (SBS block copolymer, manufactured by Kraton Polymers LLC) as a polymer, 32 parts by mass of DEHP #80030 [bis(2-ethylhexyl) phthalate, manufactured by Sigma-Aldrich] as a plasticizer, 10 parts by mass of A-HD-N (hexanediol diacrylate, manufactured by SHIN-NAKAMURA CHEMICAL CO., LTD.) as a monomer, 2 parts by mass of IRGACURE 651 (manufactured by BASF) as a photopolymerization initiator, and 1 part by mass of a dye and a thermal stabilizer were kneaded to prepare a resin composition F.

<Production of Flexographic Printing Plate Precursor>

To a binder polymer formed of 75 parts by mass of acrylic resin and 25 parts by mass of nitrile rubber (NBR), 100 parts by mass of carbon black and 3 parts by mass of a plasticizer were added, 815 parts by mass of methyl isobutyl ketone as a solvent was further added thereto, and the materials were mixed by a stirring machine. The obtained liquid mixture was dispersed by a roll mill and then methyl isobutyl ketone was further added thereto, thereby preparing an infrared ablation composition.

The obtained infrared ablation composition was applied to a substrate of a PET film having a thickness of 100 mm, as a cover film, one surface of which was coated with a pressure sensitive adhesion preventing agent in advance, by using a bar coater so as to have a thickness of 3 μm after being dried.

Then, the previously prepared resin composition F was interposed between a substrate of a PET film having a thickness of 125 μm, as a support, one surface of which was coated with an adhesive in advance, and the cover film, and the laminate was pressed by a pressing machine heated at 120° C. such that the thickness excluding the cover film was 1.14 mm. Thus, a flexographic printing plate precursor was obtained.

<Production of Flexographic Printing Plate>

Chemical rays (light source: Philips infrared low pressure mercury lamp, illuminance at 365 nm: 32 mW/cm$^2$) were applied from the support side of the flexographic printing plate precursor obtained in the above for 15 seconds. Then, the cover film was peeled off.

The plate from which the cover film was peeled off was wound around Esko CDI SPARK4835 and imaged at a resolution of 4,000 dpi. At this time, an ablation layer was prepared so as to have an image area in which the depth of the recessed portion in each section had the value shown in the following first table below and a non-image area.

After imaging, the plate was taken out, returned to a flat plane, and irradiated with chemical rays (light source: Philips infrared low pressure mercury lamp, illuminance at 365 nm: 32 mW/cm$^2$) for 420 seconds.

Then, methyl ethyl ketone (MEK, manufactured by Idemitsu Kosan Co., Ltd.) was dropped onto the plate and rubbed with a pig bristle brush, and the plate washed with flowing water, thereby performing development. After development, the plate was dried at 60° C. for 10 minutes, irradiated with chemical rays (light source: Philips infrared low pressure mercury lamp, illuminance at 365 nm: 32 mW/cm$^2$) for 600 seconds, and finally irradiated with a germicidal lamp for 300 seconds for removing the pressure sensitive adhesiveness on the surface (detag).

[Evaluation]

[Ink Transferability]

The obtained flexographic printing plate was set in a printing machine (ILF-270-4F, manufactured by TAIYO KIKAI Ltd.), and printing was continuously performed at 40 m/min using an aqueous flexographic indigo (HYDRIC FCG 739, manufactured by Dainichiseika Color & Chemicals Mfg. Co., Ltd.) as an ink and Taiko OPP film FOS-AQ (manufactured by Futamura Chemical Co., Ltd.) as printing paper. The ink transferability was compared based on the degree of ink attachment in the D section on the printed matter 1,000 m from the start of printing.

The evaluation for ink transferability was performed based on the following standards by measuring the density of the D section on the obtained printed matter at three points with a portable reflective densitometer (manufactured by X-Rite, Inc.) twice, and calculating an average value of measurement values of a total of 6 times of measurements.

A: The average value of density is 1.75 or more.

B: The average value of density is less than 1.75 and 1.60 or more.

C: The average value of density is less than 1.60.

[Printing Quality]

<Moire>

The evaluation for moire was performed based on the following standards by periodically visually observing the degree of the occurrence of unevenness in the A section on the printed matter obtained in the evaluation for ink transferability.

A: Unevenness cannot be observed.

B: Slight unevenness can be observed but is at a level free from practical problems.

C: Apparent unevenness can be observed.

<Filling-Up>

The evaluation for filling-up was performed based on the following standards by visually observing the degree of clogging of ink between the halftone dots in the B section on the printed matter obtained in the evaluation for ink transferability.

A: The number of places of ink clogging per 1 cm$^2$ is 1 or less.

B: The number of places of ink clogging per 1 cm$^2$ is 2 to 9.

C: The number of places of ink clogging per 1 cm$^2$ is 10 or more.

<Reverse>

The evaluation for reverse was performed based on the following standards by visually observing the degree of ink transfer corresponding to the image area and the non-image area in the C section on the printed matter obtained in the evaluation for ink transferability.

A: The amount of ink of the small dots is larger than the amount of ink of the non-image area (determined based on density)

B: The amount of ink of the small dots is the same as the amount of ink of the non-image area (determined based on density)

C: The amount of ink of the non-image area is larger than the amount of ink of the small dots (determined based on density)

<Collapse>

The evaluation for collapse was performed based on the following standards by visually observing the degree of ink transfer of the non-image area in the C section on the printed matter obtained in the evaluation for ink transferability.

A: There is no ink clogging in the non-image area.

B: Slight ink clogging occurs in the non-image area but is at a level free from practical problems.

C: Ink clogging occurs in the non-image area and is at a level causing problems.

TABLE 2

| Second table | Horizontal pitch xp | Vertical pitch yp | Rotation a |
|---|---|---|---|
| Pattern I | 2 | 1 | 0° |
| Pattern II | 1 | 3 | 25° |
| Pattern III | 3 | 3 | 25° |

As shown in the following first table, it was found that in a case of not forming recessed portions in the image area, ink

TABLE 1

| First table | | | Formulation | Recessed portion forming pattern Kind | Formation method | Depth of recessed portion (μm) A section | B section | C section | D section | Ink transferability D section | Printing quality Moire A section | Filling-Up B section | Reverse C section | Collapse C section |
|---|---|---|---|---|---|---|---|---|---|---|---|---|---|---|
| Example | 1 | | Formulation A | Pattern I | Method 1 | 6 | 11 | 16 | 20 | A | A | A | A | A |
| | 2 | | Formulation A | Pattern I | Method 1 | 9 | 11 | 16 | 20 | A | B | A | A | A |
| | 3 | | Formulation A | Pattern I | Method 1 | 6 | 7 | 16 | 20 | A | A | B | A | A |
| | 4 | | Formulation A | Pattern I | Method 1 | 6 | 13 | 16 | 20 | A | A | B | A | A |
| | 5 | | Formulation A | Pattern I | Method 1 | 6 | 11 | 11 | 20 | A | A | A | A | B |
| | 6 | | Formulation A | Pattern I | Method 1 | 6 | 11 | 16 | 20 | A | A | A | A | B |
| | 7 | | Formulation A | Pattern I | Method 1 | 6 | 11 | 16 | 17 | B | A | A | A | A |
| | 8 | | Formulation A | Pattern I | Method 1 | 6 | 11 | 16 | 23 | B | A | A | A | A |
| | 9 | | Formulation A | Pattern I | Method 1 | 0 | 8 | 12 | 18 | A | A | A | A | A |
| | 10 | | Formulation A | Pattern I | Method 1 | 8 | 12 | 15 | 22 | A | A | A | A | A |
| | 11 | | Formulation A | Pattern I | Method 1 | 10 | 15 | 18 | 23 | B | B | B | B | B |
| | 12 | | Formulation A | Pattern I | Method 1 | 0 | 0 | 9 | 11 | B | B | B | B | B |
| | 13 | | Formulation A | Pattern I | Method 1 | 9 | 9 | 9 | 20 | A | B | A | B | B |
| | 14 | | Formulation A | Pattern II | Method 1 | 6 | 11 | 16 | 20 | A | A | A | A | A |
| | 15 | | Formulation A | Pattern III | Method 1 | 6 | 11 | 16 | 20 | B | B | B | B | B |
| | 16 | | Formulation B | Pattern I | Method 1 | 6 | 11 | 16 | 20 | A | A | A | A | A |
| | 17 | | Formulation C | Pattern I | Method 1 | 6 | 11 | 16 | 20 | A | A | A | A | A |
| | 18 | | Formulation D | Pattern I | Method 1 | 6 | 11 | 16 | 20 | A | A | A | A | A |
| | 19 | | Formulation E | Pattern I | Method 1 | 6 | 11 | 16 | 20 | A | A | A | A | A |
| | 20 | | Formulation F | Pattern I | Method 2 | 6 | 11 | 16 | 20 | A | A | A | A | A |
| Comparative Example | 1 | | Formulation A | Pattern I | Method 1 | 0 | 0 | 0 | 0 | C | A | B | C | B |
| | 2 | | Formulation A | Pattern I | Method 1 | 11 | 11 | 11 | 11 | B | C | A | B | B |
| | 3 | | Formulation A | Pattern I | Method 1 | 20 | 20 | 20 | 20 | A | C | C | B | C |

A section: region having a halftone dot area ratio of more than 0% to 30% or less
B section: region having a halftone dot area ratio of more than 30% to 70% or less
C section: region having a halftone dot area ratio of more than 70% to 90% or less
D section: region having a halftone dot area ratio of more than 90% to 100% or less transferability was deteriorated (Comparative Example 1). It was found that in a case of forming recessed portions having uniform depth in the image area, ink transferability was good but printing quality (particularly, moire suppressing effect) was deteriorated (Comparative Examples 2 to 3).

On the other hand, it was found that in all cases of providing recessed portions having a depth becoming deeper according to the halftone dot area ratio at the small dots in the halftone dot portion and the solid portion of the image area, or the small dots in the halftone dot portion, ink transferability and printing quality were good (Examples 1 to 20).

Particularly, in the comparison of Examples 1 and 2, it was found that in a case where the depth of the recessed portion in the region having a halftone dot area ratio of more than 0% and 30% or less (A section) was 8 μm or less, the effect of suppressing moire was high.

In the comparison of Examples 1 and 3 and 4, it was found that in a case where the depth of the recessed portion in the region having a halftone dot area ratio of more than 30% and 70% or less (B section) was 8 μm or more and 12 μm or less, the effect of suppressing filling-up was high.

In the comparison of Examples 1 and 5 and 6, it was found that in a case where the depth of the recessed portion in the region having a halftone dot area ratio of more than 70% and 90% or less (C section) was 12 μm or more and 16 μm or less, the effect of suppressing collapse was high.

In the comparison of Examples 1 and 7 and 8, it was found that in a case where the depth of the recessed portion in the region having a halftone dot area ratio of more than 90% and 100% or less (D section) was 18 μm or more and 22 μm or less, ink transferability was further improved.

In the comparison of Examples 1, 14, and 15, it was found that in a case where recessed portions formed by using Pattern I and Pattern II as the recessed portion forming patterns, that is, recessed portions formed by grooves continuously formed in a direction orthogonal to the depth direction, ink transferability and printing quality were further improved.

EXPLANATION OF REFERENCES

1: flexographic printing plate
2: relief layer
3: image area
3a: halftone dot portion
3b: solid portion
4: non-image area
5: recessed portion
Da, Db: depth of recessed portion
W: width of recessed portion
30: flexographic printing apparatus
31: drum
32: transport roller
33: anilox roller
34: doctor chamber
35: circulation tank
60: calender roll
62a to 62d: first roller to fourth roller
70: kneaded product
71: uncured layer
z: object to be printed

What is claimed is:

1. A flexographic printing plate comprising:
a relief layer including a non-image area and an image area,
wherein the image area has a halftone dot portion having a halftone dot area ratio of more than 0% and less than 100%, and a solid portion having a halftone dot area ratio of 100%,
small dots in the halftone dot portion and the solid portion or small dots in the halftone dot portion have two or more recessed portions having different depths according to a halftone dot area ratio, and
the two or more recessed portions having different depths are recessed portions whose depth becomes deeper as the halftone dot area ratio increases.

2. The flexographic printing plate according to claim 1, wherein a depth of the recessed portion is 10 μm or less in a region having a halftone dot area ratio of more than 0% and 30% or less.

3. The flexographic printing plate according to claim 1, wherein a depth of the recessed portion is 15 μm or less in a region having a halftone dot area ratio of more than 30% and 70% or less.

4. The flexographic printing plate according to claim 2, wherein a depth of the recessed portion is 15 μm or less in a region having a halftone dot area ratio of more than 30% and 70% or less.

5. The flexographic printing plate according to claim 1, wherein a depth of the recessed portion is 9 μm or more and 18 μm or less in a region having a halftone dot area ratio of more than 70% and 90% or less.

6. The flexographic printing plate according to claim 2, wherein a depth of the recessed portion is 9 μm or more and 18 μm or less in a region having a halftone dot area ratio of more than 70% and 90% or less.

7. The flexographic printing plate according to claim 3, wherein a depth of the recessed portion is 9 μm or more and 18 μm or less in a region having a halftone dot area ratio of more than 70% and 90% or less.

8. The flexographic printing plate according to claim 4, wherein a depth of the recessed portion is 9 μm or more and 18 μm or less in a region having a halftone dot area ratio of more than 70% and 90% or less.

9. The flexographic printing plate according to claim 1, wherein a depth of the recessed portion is 11 μm or more and 23 μm or less in a region having a halftone dot area ratio of more than 90% and 100% or less.

10. The flexographic printing plate according to claim 2, wherein a depth of the recessed portion is 11 μm or more and 23 μm or less in a region having a halftone dot area ratio of more than 90% and 100% or less.

11. The flexographic printing plate according to claim 3, wherein a depth of the recessed portion is 11 μm or more and 23 μm or less in a region having a halftone dot area ratio of more than 90% and 100% or less.

12. The flexographic printing plate according to claim 4, wherein a depth of the recessed portion is 11 μm or more and 23 μm or less in a region having a halftone dot area ratio of more than 90% and 100% or less.

13. The flexographic printing plate according to claim 5, wherein a depth of the recessed portion is 11 μm or more and 23 μm or less in a region having a halftone dot area ratio of more than 90% and 100% or less.

14. The flexographic printing plate according to claim 6, wherein a depth of the recessed portion is 11 μm or more and 23 μm or less in a region having a halftone dot area ratio of more than 90% and 100% or less.

15. The flexographic printing plate according to claim 7, wherein a depth of the recessed portion is 11 μm or more and 23 μm or less in a region having a halftone dot area ratio of more than 90% and 100% or less.

16. The flexographic printing plate according to claim 1, wherein the recessed portions are formed by grooves which are continuously formed in a direction orthogonal to a depth direction.

17. The flexographic printing plate according to claim 2, wherein the recessed portions are formed by grooves which are continuously formed in a direction orthogonal to a depth direction.

18. The flexographic printing plate according to claim 3, wherein the recessed portions are formed by grooves which are continuously formed in a direction orthogonal to a depth direction.

19. The flexographic printing plate according to claim 5, wherein the recessed portions are formed by grooves which are continuously formed in a direction orthogonal to a depth direction.

20. The flexographic printing plate according to claim 9, wherein the recessed portions are formed by grooves which are continuously formed in a direction orthogonal to a depth direction.

* * * * *